United States Patent [19]

Thepault

[11] Patent Number: 4,895,524

[45] Date of Patent: Jan. 23, 1990

[54] INTERFACE DEVICE HAVING RIGID PLANAR ELEMENTS AND FLEXIBLE PRINTED CIRCUITS

[75] Inventor: Claude Thepault, Milan, Italy

[73] Assignee: CROUZET S.P.A., Baranzate Di Bollate, Italy

[21] Appl. No.: 171,474

[22] Filed: Mar. 21, 1988

[30] Foreign Application Priority Data

Mar. 23, 1987 [IT] Italy ................................ 19807 A/87

[51] Int. Cl.$^4$ ................................................ H01R 9/09
[52] U.S. Cl. ...................................... 439/74; 361/398
[58] Field of Search .................... 361/398; 439/67, 77, 439/492–499, 74, 75

[56] References Cited

U.S. PATENT DOCUMENTS

| | | | |
|---|---|---|---|
| 3,319,216 | 5/1967 | McCullough | 439/67 |
| 3,723,635 | 3/1973 | Smith | 174/68.5 |
| 3,971,127 | 7/1976 | Giguere et al. | 361/398 |
| 4,495,546 | 1/1985 | Nakamura et al. | 361/398 |
| 4,677,529 | 6/1987 | Watanabe et al. | 361/398 |

FOREIGN PATENT DOCUMENTS 2427412 7/1975 Fed. Rep. of Germany ...... 361/398

Primary Examiner—Neil Abrams
Attorney, Agent, or Firm—Herbert Dubno

[57] ABSTRACT

An electrical interface device for washing and drying machines and the like, has at least one rigid planar element, to which there are firmly applied one or more flexible printed circuits, electrically connected to one another and to the electromechanical and/or electronic programming component of the machine. The edges of the rigid planar element and of the flexible printed circuits are provided with alternating slots and teeth. To the teeth there are applied the terminals of the electrical paths of the circuits, forming in this manner zones adapted for the insertion of electrical connectors of low and high power.

9 Claims, 2 Drawing Sheets

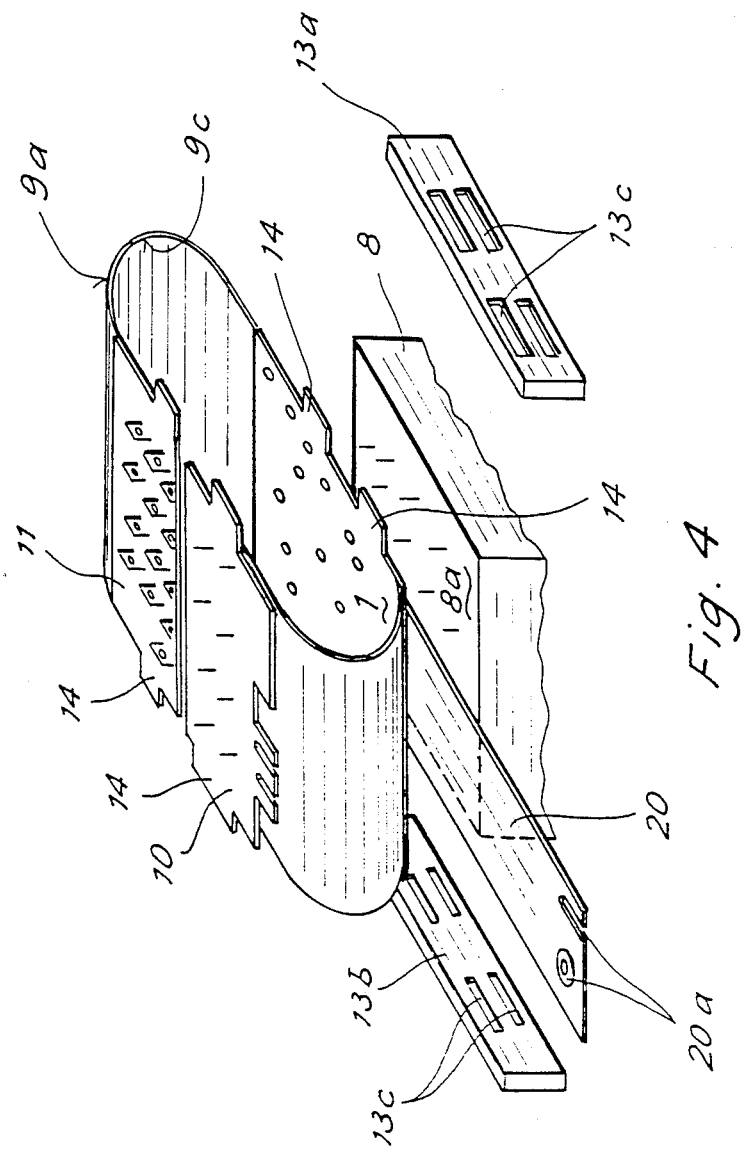

INTERFACE DEVICE HAVING RIGID PLANAR ELEMENTS AND FLEXIBLE PRINTED CIRCUITS

FIELD OF THE INVENTION

The present invention relates to an interface connection structure especially for the electrical equipment of washing machines and the like.

BACKGROUND OF THE INVENTION

The control of the cycle sequences of washing machines and the like is realized by an electromechanical and/or electronic programmer, to which are connected all of the electrical power and control cables of the various electrically operated components, such as: motors, pumps, resistance heaters and the like. All the aforementioned cables are, at present, connected to the programmer by means of connectors of various types, but individually and without a precise logical order of connection, in that the arrangement of the electrical outputs of the programmer is associated with its internal structure and not with the final operating diagram or layout. Furthermore, no distinction is made between power outputs and non-power outputs, which necessitates over-dimensioning of those outputs which, being intended for carrying a current less than five amps, could be constructed in a different manner at a much lesser cost. In an attempt to overcome these disadvantages, certain types of centralized units applied in the automobile industry are known, but these are not ideal as far as the internal cabling of the various contact points, the sizes, the weight and the production costs, are concerned.

OBJECT OF THE INVENTION

The object of the present invention is to provide an improved connector interface which will obviate the aforementioned disadvantages, particularly for washing machines and the like, and which is extremely compact, have a minimum number of internal cables and allows the connectors to be arranged in an orderly manner in the sense of affinity of use, while at the same time achieving the best orientation possible of the outputs in the direction of the final user device, as well as, when required, the realization of the power outputs in a different manner from that of the non-power outputs.

SUMMARY OF THE INVENTION

This objects is achieved by the interface connection device according to the present invention, which realized the interconnection, arrangement and orientation of the electrical outputs of electromechanical and/or electronic programming components. The connection device comprises at least one rigid planar element, to which there are firmly applied one or more flexible printed circuits, electrically connected among themselves and to the electromechanical programming component. The edges of the rigid planar element and of said flexible printed circuits are profiled with alternating slots and teeth. To the teeth are applied the terminals of the external paths of the circuits, in this manner realizing zones adapted for the insertion of electrical connectors of low and high power.

The rigid planar element can be a printed circuit of the rigid type and that the flexible printed circuits can be of a larger size than the rigid plane element. The device according to this invention furthermore provides that the rigid planar elements may be greater than one in number, disposed below and above said flexible printed circuits in accordance with a suitable combination of rigid planar elements, rigid printed circuits and supports for power outputs, in such manner that the rigid elements shall be outside the pack of printed circuits after they have been folded and have been made electrically and mechanically integral with the programmer and with the flexible printed circuits, which are folded over onto themselves so as to bring the upper rigid elements into one plane parallel to that of the lower element.

The mechanical rigidity of the device constructed in this manner is assured by two planar elements, equipped with openings adapted for receiving corresponding projections for fixing, formed on the edges of the rigid elements.

It is also provided that the alternation of slots and teeth shall be geometrically such as to produce zones for insertion of asymmetrical connectors, thereby ensuring a polarization which prevents incorrect insertion on the teeth of the terminals of the electrical paths, which are arranged and grouped on said teeth on the basis of their final functional or practical affinity. This arrangement and grouping may also be achieved on the basis of closer proximity of the insertion zone for the electrical connectors to the destination component for the signals.

BRIEF DESCRIPTION OF THE DRAWING

The above and other objects, features and advantages of my invention will become more readily apparent from the following description, reference being made to the accompanying highly diagrammatic drawing in which:

FIG. 4 is a perspective exploded view, partly broken away of another embodiment of the device.

SPECIFIC DESCRIPTION

Figure 1:
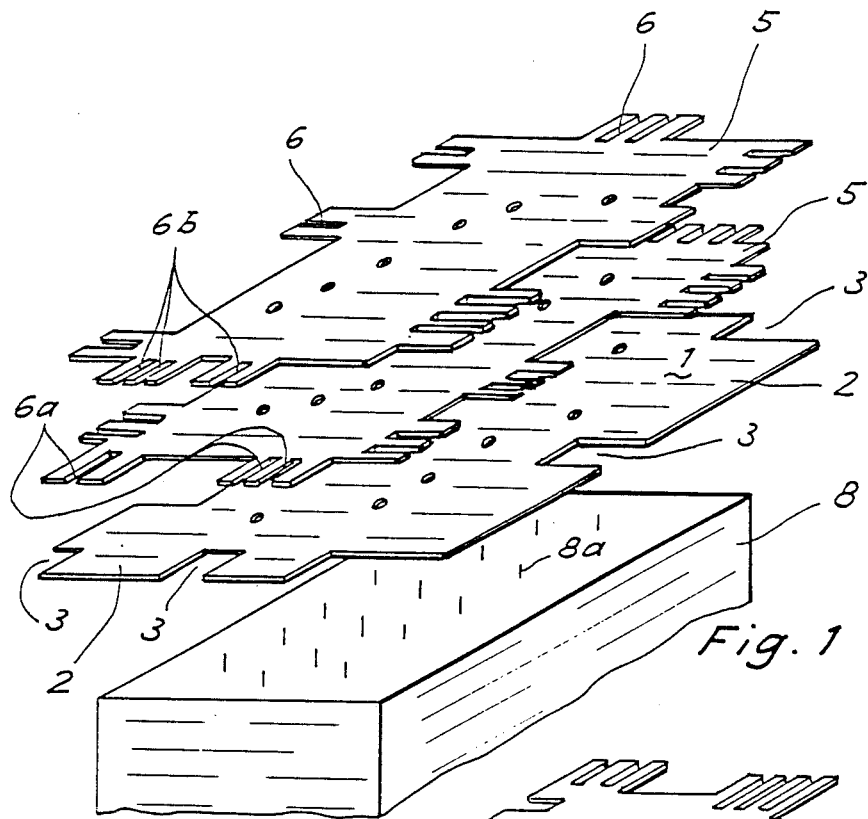
FIG. 1 is a perspective exploded view of the components, the device not being yet connected.

FIG. 1 shows a device constituted of a planar rigid element 1, the perimeter of which is shaped to have projections 2, separated by slots 3, forming an insertion zone for a connector 4 (FIG. 1)). On the upper face of the rigid planar element 1, there are firmly attached by a known technique one or more printed circuits 5 of the flexible type 5, the edges of which are shaped in such a manner that the zones in which the electrical connection strips 6 are formed coincide, although on different planes, with the corresponding zones 2 of the rigid element 1.

Figure 3:
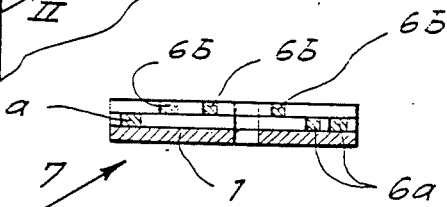
FIG. 3 an enlarged section of the device taken along the line II—II in FIG. 2.

In this manner, as illustrated in the enlarged section of FIG. 3, it is possible to keep the density of paths for each flexible circuit sufficiently low and to optimize the arrangement of the paths and of the electrical interconnections, reducing crossings to a minimum, and forming at the same time a connection zone, generally referenced 7, in which the different contact strips 6a and 6b can be selected from among those that are alike, for example for function or for destination of use (such as all the controls of the pump).

The alternation of projections 2 and slots 3 can make the connection zones 7 asymmetrical among themselves, thereby achieving a polarization, as a result of which it is possible to avoid the frequent errors of inser tion of the single connectors. By choosing, at the design stage, the various distributions of connections desired, it will also be possible to choose the sides of the printed circuits upon which specific connections are to be formed, for example on the basis of closest proximity of this side to the final destination of that particular item of cabling.

Figure 2:
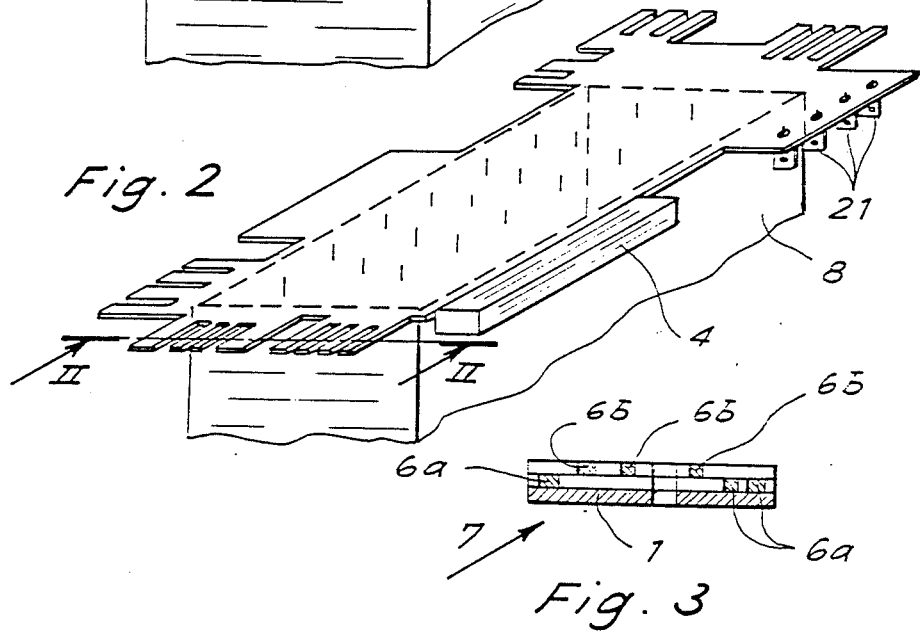
FIG. 2 is a perspective view of the assembled device.

With reference to FIG. 2, there is also shown the construction of terminals 21, in this example of the lamellar type known as "fast-on", adapted for receiving power connectors for loads greater than 12 amperes.

The interface device constructed in this manner is then applied to the programmer 8 according to the desired arrangement of the holes and of the needles 8a of the programmer and, after this, by flow soldering, made possible by the fact that all the components, including the power outputs 21 appropriately pointing downwards, again lie on a single plane, is electrically and mechanically connected to it.

If the greater complexity of the circuits or the need to contain the final costs of the product demand it, it would be possible to construct the interface device by realizing the rigid planar element as a printed circuit of the rigid type, which assures simultaneously the mechanical rigidity and the presence of further electrical paths.

One possible variant is illustrated in FIG. 4, in which it is shown that there are applied to the rigid planer element 1 flexible printed circuits which may have a larger dimension than that of the rigid planar element. In this manner, two rigid elements, selected according to the requirements, may be welded onto the free and projecting flexible circuit portions 9a, 9b, 9c. In this embodiment, the rigid elements include a rigid printed circuit 10 and a support for power outputs 11.

It is also possible to keep a portion 20 of a flexible printed circuit free, with its end carrying suitable conductor zones 20a, and of a length such that it can be directly connected to a final user component instead of to a cable.

Once the already described flow soldering has been carried out, it will be possible to bend the flexible circuits upwards, causing the ends of the two elements 10 and 11 to fit together and rendering the structure thus obtained mechanically rigid by means of the engagement therewith of two retaining elements 13a and 13b, the apertures 13c of which should be fitted onto the corresponding fixing projections 14, formed respectively on the edges of the rigid elements 1, 10 and 11.

The rigid elements 1, 10 and 11 can be preselected in accordance with a suitable combination of rigid planar elements rigid printed circuit and support for power outputs.

The supporting structure thus formed is adapted for withstanding, under operating conditions, the loads and/or pressures resulting from the insertion and removal of the female connectors without the possibility of accidental contacts taking place between the facing contact points.

The application of the interface device to the electromechanical and/or electronic components as described also enables the or some of the male connectors to be grouped in such a manner as to permit the separate construction of the associated cabling with female terminal connectors already fitted, in such a way as to reduce production costs and to eliminate the possibility of mistakes in connecting up the component with the various items of equipment controlled or operated by it.

It will be understood that, for each electromechanical and/or electronic component, to which the interface device according to this invention is to be applied, it is necessary to adapt the dimensions and shape of the profiled members and of the printed circuits to the particular requirements and arrangements of each component, without thereby departing from the scope of the present invention.

I claim:

1. An electrical interface connector for a washing machine or the like, comprising:
    an electromechanical programmer for said washing machine having a surface and pins projecting from said surface for electrical connection to the programmer;
    a rigid planar element lying flat against said surface, traversed by said pins and affixed to said programmer by soldering to said pins, said rigid planar element having generally a rectangular configuration formed with notches along edges thereof defining respective rectangular projections asymmetric with respect to one another;
    a flexible printed circuit lying flat against said rigid planar element and traversed by at least some of said pins and soldered thereto, said flexible printed circuit having groups of contact strips overlying respective ones of said rectangular projections with ends of said contact strips being coterminous with ends of the respective projections; and
    respective electrical connector members each dimensioned to receive a respective one of said projections and the group of contact strips overlying same, whereby asymmetry of said projections prevents incorrect attachment of said connector members to said connector.

2. The electrical interface connector defined in claim 1, further comprising another flexible printed circuit electrically connected with said rigid element and the first mentioned printed circuit.

3. The electrical interface connector defined in claim 1 wherein said rigid element is additionally provided with power terminals.

4. An electrical interface device, comprising:
    a first rigid plane element having a pair of opposite edges, at least one of said opposite edges being formed with identifications defining projections therebetween, said first rigid element having at least one further edge between said pair of edges;
    a flexible printed circuit element juxtaposed with said rigid element, said flexible printed element having at least one end extending beyond said rigid element,s aid end being bent over said one edge of the rigid element;
    a second rigid planar element spaced from said first rigid element and electromechanically connected with said end of said flexible element, said second rigid planar element having two opposite edges parallel to said opposite edges of the first rigid element, said opposite edges of the second rigid element being formed with respective projections; and
    at least one side member formed with respective holes spaced apart, said side member being juxtaposed with respective edges of said second and first rigid elements, so that the projections of the respective edges of said second element and the projections of said first element are inserted in the respective holes of said side member.

5. The electrical interface device defined in claim 4, further comprising a third rigid element electromechanically connected with an end of said flexible element opposite said one end and being formed with respective opposite edges parallel to said opposite edges of said first rigid element and aligned with the respective opposite edges of the second rigid element, said opposite edges of said third rigid element being formed with respective projections received in said holes of said side member.

6. The electrical interface device defined in claim 5 wherein said third rigid element is formed with indentations defining respective teeth provided on an edge bridging said opposite edges of the third rigid element.

7. The electrical interface device defined in claim 6 wherein said third rigid element is connected with said second and first second elements by said side members.

8. The electrical interface device defined in claim 4 wherein said second rigid element is provided with power terminals.

9. The electrical interface device defined in claim 4 further comprises a programming electromechanical component electromechanically connected with said first rigid element.

* * * * *